US010852587B2

(12) United States Patent
Nam et al.

(10) Patent No.: US 10,852,587 B2
(45) Date of Patent: Dec. 1, 2020

(54) DISPLAY DEVICE HAVING A PHOSPHOR INCLUDING A QUANTUM DOT AND MANUFACTURING METHOD THEREOF

(71) Applicants: SAMSUNG DISPLAY CO., LTD., Yongin-si (KR); KOREA INSTITUTE OF SCIENCE AND TECHNOLOGY, Seoul (KR); KOREA ADVANCED INSTITUTE OF SCIENCE AND TECHNOLOGY, Daejeon (KR)

(72) Inventors: Minki Nam, Anseong-si (KR); Kyoungwon Park, Seoul (KR); Baekhee Lee, Yongin-si (KR); Youngmin Kim, Asan-si (KR); Haeil Park, Seoul (KR); Jaikyeong Kim, Seoul (KR); Heesuk Kim, Seoul (KR); Wanki Bae, Seoul (KR); Dohchang Lee, Guseong-dong (KR); Byeongguk Jeong, Guseong-dong (KR)

(73) Assignees: SAMSUNG DISPLAY CO., LTD.; KOREA INSTITUTE OF SCIENCE AND TECHNOLOGY; KOREA ADVANCED INSTITUTE OF SCIENCE AND TECHNOLOG

( * ) Notice: Subject to any disclaimer, the term of this patent is extended or adjusted under 35 U.S.C. 154(b) by 163 days.

(21) Appl. No.: 15/690,050

(22) Filed: Aug. 29, 2017

(65) Prior Publication Data
US 2018/0059485 A1    Mar. 1, 2018

(30) Foreign Application Priority Data

Aug. 30, 2016 (KR) .................. 10-2016-0110631

(51) Int. Cl.
    *G02F 1/13357* (2006.01)
    *G02F 1/1335* (2006.01)
    (Continued)

(52) U.S. Cl.
    CPC .. *G02F 1/133621* (2013.01); *G02F 1/133528* (2013.01); *G02F 1/133602* (2013.01);
    (Continued)

(58) Field of Classification Search
    CPC ... G02F 2001/133614; G02F 1/133514; G02F 2202/36; G02F 1/13362; G02F 1/133528;
    (Continued)

(56) References Cited

U.S. PATENT DOCUMENTS 9,138,711 B2    9/2015  Treadyway et al.
9,675,953 B2 *  6/2017  Oldenburg ............. C01B 33/18
    (Continued)

FOREIGN PATENT DOCUMENTS

KR    2011-0091691 A     8/2011
KR    2015-0111307 A    10/2015

*Primary Examiner* — Huyen L Ngo
(74) *Attorney, Agent, or Firm* — Innovation Counsel LLP (57) ABSTRACT

A display device includes: a display substrate; a light amount control layer on the display substrate; a first polarizer on the light amount control layer; and a color conversion layer on the first polarizer. The color conversion layer includes a phosphor, the phosphor includes a quantum dot, the quantum dot including: a core; a first shell surrounding the core; and a second shell surrounding the first shell, and the quantum dot has a diameter ranging from about 2 nm to about 32 nm.

13 Claims, 7 Drawing Sheets

(51) Int. Cl.
*H01L 27/32* (2006.01)
*H01L 51/00* (2006.01)
*B82Y 20/00* (2011.01)

(52) U.S. Cl.
CPC ...... *G02F 1/133617* (2013.01); *H01L 27/322* (2013.01); *H01L 51/0097* (2013.01); *B82Y 20/00* (2013.01); *G02F 2001/133614* (2013.01); *G02F 2202/36* (2013.01); *H01L 2251/5338* (2013.01); *H01L 2251/5369* (2013.01); *Y10S 977/774* (2013.01); *Y10S 977/818* (2013.01); *Y10S 977/824* (2013.01); *Y10S 977/95* (2013.01); *Y10S 977/952* (2013.01)

(58) Field of Classification Search
CPC ......... G02F 1/133621; G02F 1/133512; B82Y 20/00; F21V 9/30; C09K 11/02; C09K 11/883; C09K 11/70; G03F 7/0007; H01L 2251/5369
See application file for complete search history.

(56) References Cited

U.S. PATENT DOCUMENTS

| | | | | |
|---|---|---|---|---|
| 9,768,404 | B1* | 9/2017 | Steckel | H01L 27/1225 |
| 2008/0246388 | A1* | 10/2008 | Cheon | G02F 2/02 |
| | | | | 313/501 |
| 2010/0163798 | A1* | 7/2010 | Ryowa | C09K 11/02 |
| | | | | 252/301.4 R |
| 2010/0308272 | A1 | 12/2010 | Peng et al. | |
| 2011/0240106 | A1* | 10/2011 | Tang | C09K 11/661 |
| | | | | 136/255 |
| 2013/0026506 | A1* | 1/2013 | Arbell | C09K 11/02 |
| | | | | 257/88 |
| 2014/0211448 | A1* | 7/2014 | Wang | F21V 13/02 |
| | | | | 362/84 |
| 2014/0302627 | A1* | 10/2014 | Ko | H01L 51/502 |
| | | | | 438/35 |
| 2015/0083991 | A1* | 3/2015 | Tang | H01L 33/0083 |
| | | | | 257/13 |
| 2015/0159083 | A1 | 6/2015 | Jun et al. | |
| 2015/0308658 | A1* | 10/2015 | Shin | B32B 3/266 |
| | | | | 362/84 |
| 2015/0344776 | A1* | 12/2015 | Bootman | C09K 11/025 |
| | | | | 252/301.36 |
| 2016/0141457 | A1* | 5/2016 | Ha | H01L 33/20 |
| | | | | 257/99 |
| 2016/0200974 | A1* | 7/2016 | Smith | C30B 7/005 |
| | | | | 252/301.6 S |
| 2016/0211409 | A1* | 7/2016 | Kazama | H01L 33/06 |
| 2016/0250612 | A1* | 9/2016 | Oldenburg | C01B 33/18 |
| | | | | 428/404 |
| 2017/0075215 | A1* | 3/2017 | Lee | G03F 7/0007 |
| 2017/0123317 | A1* | 5/2017 | Kamura | G02B 5/201 |
| 2017/0137710 | A1* | 5/2017 | Miyanaga | B01J 13/02 |
| 2017/0146856 | A1* | 5/2017 | Yokota | H04N 9/12 |
| 2017/0371205 | A1* | 12/2017 | Pellerite | G02B 5/20 |
| 2019/0067379 | A1* | 2/2019 | Uchida | H01L 27/322 |
| 2019/0085239 | A1* | 3/2019 | Stenzel | C09K 11/025 |

* cited by examiner

DISPLAY DEVICE HAVING A PHOSPHOR INCLUDING A QUANTUM DOT AND MANUFACTURING METHOD THEREOF

CROSS-REFERENCE TO RELATED APPLICATION

This application claims priority under 35 U.S.C. § 119 to Korean Patent Applications No. 10-2016-0110631, filed on Aug. 30, 2016, in the Korean Intellectual Property Office (KIPO), the disclosure of which is incorporated by reference herein in its entirety.

1. TECHNICAL FIELD

Exemplary embodiments relate to a display device and a method of manufacturing the display device, and more particularly, to a display device including a color conversion layer and to a method of manufacturing the display device.

2. DISCUSSION OF RELATED ART

A liquid crystal display ("LCD") device is a type of a flat panel display (FPD), which has found wide recent applications. The LCD device includes two substrates including electrodes formed thereon and a liquid crystal layer interposed therebetween.

Upon applying voltage to the two electrodes, liquid crystal molecules of the liquid crystal layer are rearranged such that an amount of transmitted light is controlled in the LCD device. Such an LCD device includes a color filter to represent colors.

In recent times, a display device in which a color filter used in a conventional LCD device is replaced with a fluorescent pattern has been studied. Such a display device including a fluorescent pattern is referred to as a photoluminescent display ("PLD") device. The PLD device includes a polarizer between a color conversion layer and a light amount control layer.

Meanwhile, researches are being conducted to introduce a color filter to organic light emitting diode ("OLED") display devices.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Exemplary embodiments may be directed to a display device having excellent color representation capability.

According to an exemplary embodiment, a display device includes: a display substrate; a light amount control layer on the display substrate; a first polarizer on the light amount control layer; and a color conversion layer on the first polarizer. The color conversion layer includes a phosphor, the phosphor includes a quantum dot, the quantum dot including: a core; a first shell surrounding the core; and a second shell surrounding the first shell, and the quantum dot has a diameter ranging from about 2 nm to about 32 nm.

The quantum dot may have a diameter ranging from about 9 nm to about 15 nm.

The core may have a diameter ranging from about 0.4 nm to about 7 nm.

The core may have a diameter ranging from about 2 nm to about 4 nm.

The first shell may have a thickness ranging from about 0.2 nm to about 2.5 nm.

The first shell may have a thickness ranging from about 0.3 nm to about 1.5 nm.

The second shell may have a thickness ranging from about 0.5 nm to about 10 nm.

The second shell may have a thickness ranging from about 3 nm to about 5 nm.

The color conversion layer may include: a red color conversion portion configured to absorb a blue light to emit a red light; and a green color conversion portion configured to absorb a blue light to emit a green light.

The color conversion layer may further include a transmissive portion configured to transmit a blue light.

The display device may further include a second polarizer on the display substrate.

The light amount control layer may include a liquid crystal layer.

The core may include at least one of: ZnTe, CdS, and GaP.

The first shell may include at least one of: InP, CdSe, ZnSe, and ZnTe.

The second shell may include at least one of: ZnS, CdS, GaP, and ZnTe.

According to an exemplary embodiment, an organic light emitting diode display device includes: a base substrate; an organic light emitting diode on the base substrate; and a color conversion layer on the organic light emitting diode. The color conversion layer includes a phosphor, the phosphor includes a quantum dot, the quantum dot including: a core; a first shell surrounding the core; and a second shell surrounding the first shell, and the quantum dot has a diameter ranging from about 2 nm to about 32 nm.

The quantum dot may have a diameter ranging from about 9 nm to about 15 nm.

The core may have a diameter ranging from about 0.4 nm to about 7 nm.

The core may have a diameter ranging from about 2 nm to about 4 nm.

The first shell may have a thickness ranging from about 0.2 nm to about 2.5 nm.

The first shell may have a thickness ranging from about 0.3 nm to about 1.5 nm.

The second shell may have a thickness ranging from about 0.5 nm to about 10 nm.

The second shell may have a thickness ranging from about 3 nm to about 5 nm.

The organic light emitting diode may be configured to emit a blue light.

The color conversion layer may include: a red color conversion portion configured to absorb a blue light to emit a red light; and a green color conversion portion configured to absorb a blue light to emit a green light.

The color conversion layer may further include a transmissive portion configured to transmit a blue light.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the inventive concept will become more apparent by describing in detail exemplary embodiments thereof with reference to the accompanying drawings, wherein.

DETAILED DESCRIPTION

Features of the inventive concept and methods for achieving them will be made clear from exemplary embodiments described below in detail with reference to the accompanying drawings. The inventive concept may, however, be embodied in many different forms and should not be construed as being limited to the exemplary embodiments set forth herein. Rather, these exemplary embodiments are provided so that this disclosure will be thorough and complete, and will fully convey the scope of the inventive concept to those skilled in the art. The inventive concept is merely defined by the scope of the claims. Therefore, well-known constituent elements, operations and techniques are not described in detail in the exemplary embodiments in order to prevent the inventive concept from being obscurely interpreted. Like reference numerals refer to like elements throughout the specification.

In the drawings, certain elements or shapes may be illustrated in an enlarged manner or in a simplified manner to better illustrate the inventive concept, and other elements present in an actual product may also be omitted. Thus, the drawings are intended to facilitate the understanding of the inventive concept.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have a same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a first exemplary embodiment will be described with reference to FIGS. 1, 2, and 3.

Figure 1:
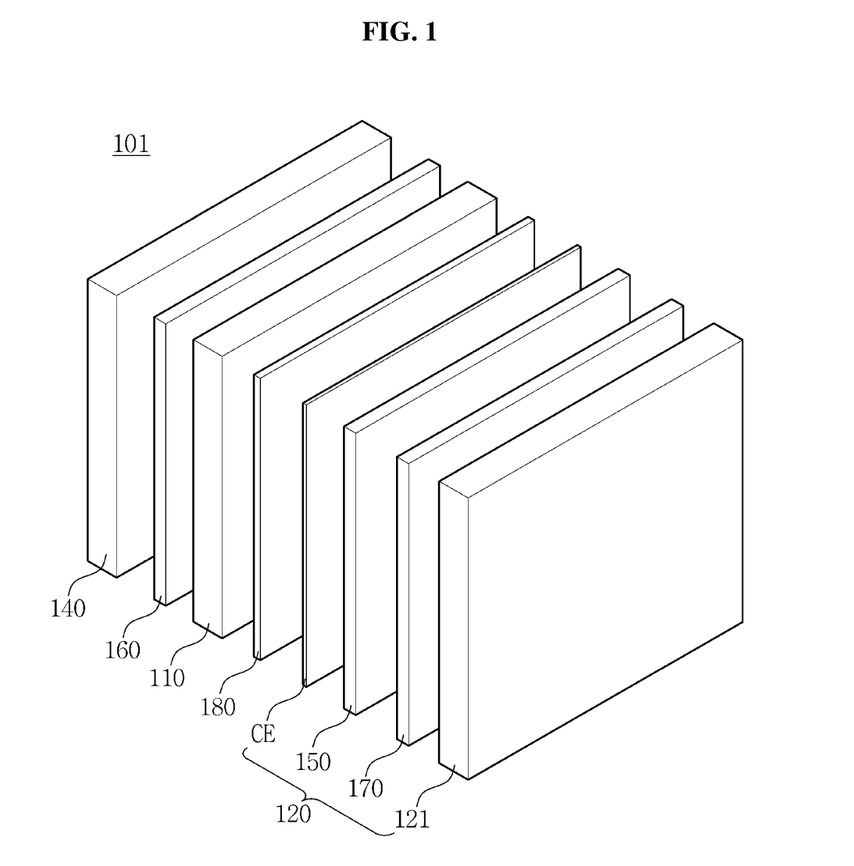
FIG. 1 is an exploded perspective view illustrating a display device according to a first exemplary embodiment.

FIG. 1 is an exploded perspective view illustrating a display device 101 according to a first exemplary embodiment.

Referring to FIG. 1, the display device 101 according to the first exemplary embodiment includes a backlight unit 140, a second polarizer 160, a display substrate 110, a light amount control layer 180, and an opposing substrate 120 that are sequentially disposed. The opposing substrate 120 includes a common electrode CE, a first polarizer 150, a color conversion layer 170, and a second substrate 121.

The backlight unit 140 may irradiate ultraviolet (UV) light, rear UV light, or the like. For example, the backlight unit 140 may irradiate white light or blue light toward the display substrate 110. Hereinbelow, the first exemplary embodiment will be described with respect to a display device including a backlight unit 140 that emits blue light.

Figure 2:
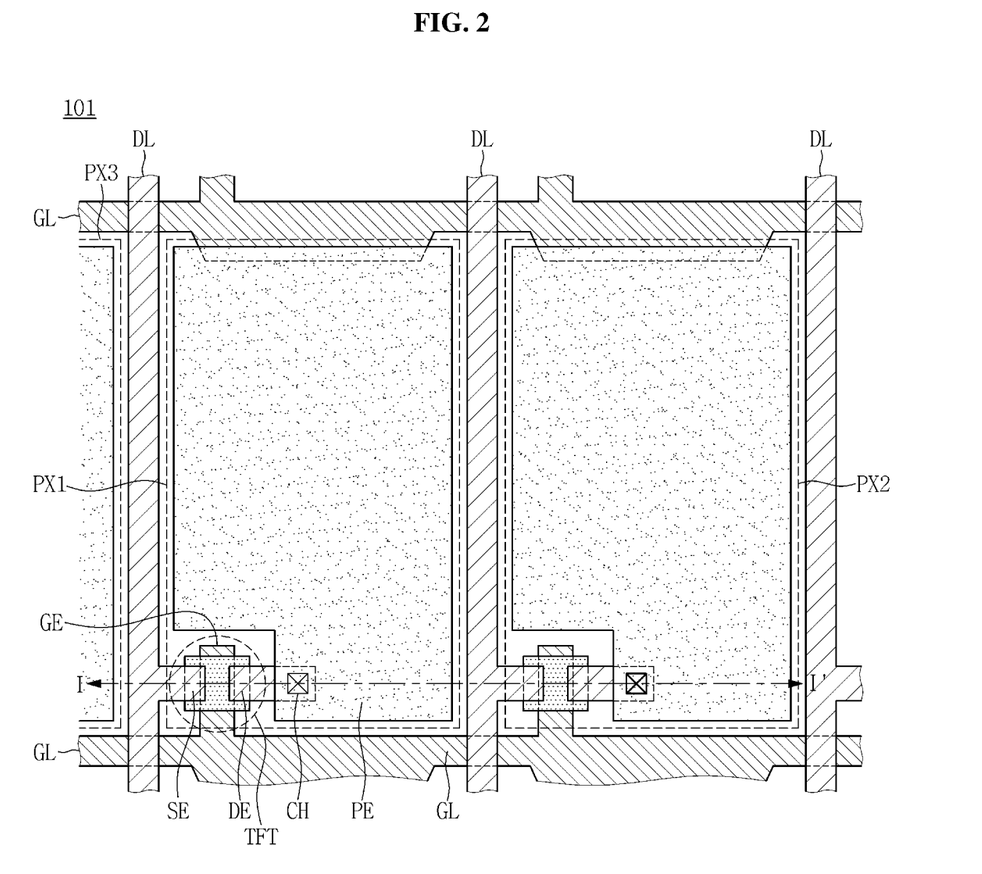
FIG. 2 is a plan view illustrating a pixel of the display device of FIG. 1.
Figure 3:
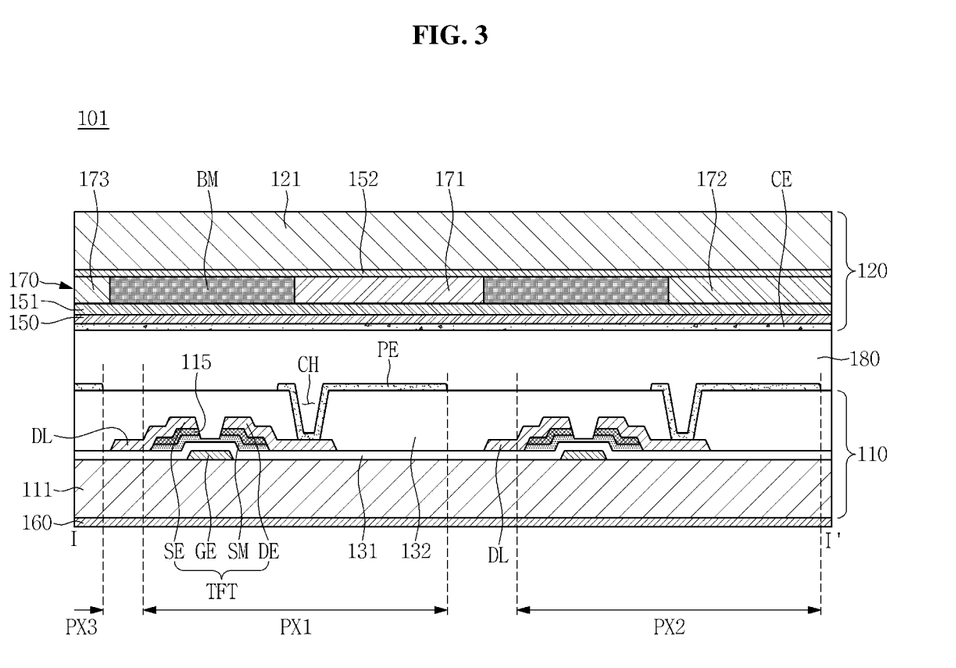
FIG. 3 is a cross-sectional view taken along line I-I' of FIG. 2.

FIG. 2 is a plan view illustrating a pixel of the display device 101 of FIG. 1, and FIG. 3 is a cross-sectional view taken along line I-I' of FIG. 2.

As illustrated in FIGS. 2 and 3, the display device 101 according to the first exemplary embodiment includes the display substrate 110, the opposing substrate 120 opposing the display substrate 110, and the light amount control layer 180 between the display substrate 110 and the opposing substrate 120.

The light amount control layer 180 may use any light amount control layer that may control the transmittance of light provided from the backlight unit 140. For example, the light amount control layer 180 may be one of a liquid crystal layer, an electro-wetting layer, and an electrophoretic layer. Hereinbelow, the light amount control layer 180 will be described with respect to a liquid crystal layer, by way of example. In such an exemplary embodiment, the display device 101 according to the first exemplary embodiment may be referred to as a liquid crystal display ("LCD") device.

The display substrate 110 includes a first substrate 111, a thin film transistor TFT, a pixel electrode PE, a gate insulating layer 131, and a protection layer 132. The thin film transistor TFT includes a semiconductor layer SM, an ohmic contact layer 115, a gate electrode GE, a source electrode SE, and a drain electrode DE.

The first substrate 111 includes transparent materials such as glass or plastic.

A plurality of gate lines GL and the gate electrode GE are disposed on the first substrate 111. The gate line GL and the gate electrode GE are unitary. The gate line GL and the gate electrode GE may include or be formed of one of: aluminum (Al) or alloys thereof, silver (Ag) or alloys thereof, copper (Cu) or alloys thereof, molybdenum (Mo) or alloys thereof, chromium (Cr), tantalum (Ta), and/or titanium (Ti). At least one of the gate line GL and the gate electrode GE may have a multilayer structure including at least two conductive layers that have different physical properties.

The gate insulating layer 131 is disposed over an entire surface of the first substrate 111 including the gate line GL and the gate electrode GE. The gate insulating layer 131 may include silicon nitride ($SiN_x$) or silicon oxide ($SiO_x$). In addition, the gate insulating layer 131 may have a multilayer structure including at least two insulating layers having different physical properties.

The semiconductor layer SM is disposed on the gate insulating layer 131. In such an exemplary embodiment, the semiconductor layer SM overlaps the gate electrode GE below the gate insulating layer 131. The semiconductor layer SM may include or be formed of amorphous silicon, polycrystalline silicon, or the like. The semiconductor layer SM may include an oxide semiconductor material.

The ohmic contact layer 115 is disposed on the semiconductor layer SM. For example, the ohmic contact layer 115 is disposed on a portion of the semiconductor layer SM aside from a channel area of the semiconductor layer SM.

In addition, a plurality of data lines DL are disposed on the gate insulating layer 131. The data line DL intersects the gate line GL. The source electrode SE and the data line DL are unitary. The source electrode SE is disposed on the ohmic contact layer 115. The drain electrode DE is disposed on the ohmic contact layer 115 and is connected to the pixel electrode PE.

At least one of the data line DL, the source electrode SE, and the drain electrode DE may include or be formed of a refractory metal, such as molybdenum, chromium, tantalum, and titanium, or an alloy thereof, and may have a multilayer structure including a refractory metal layer and a low-resistance conductive layer.

The protection layer 132 is disposed over an entire surface of the first substrate 111 including the semiconductor layer SM, the data line DL, the source electrode SE, and the drain electrode DE. The protection layer 132 may include an inorganic insulating material such as silicon nitride ($SiN_x$) or silicon oxide ($SiO_x$). In an alternative exemplary embodiment, the protection layer 132 may include an organic layer. In another alternative exemplary embodiment, the protection layer 132 may have a double-layer structure including a lower inorganic layer and an upper organic layer.

The pixel electrode PE is disposed on the protection layer 132. In such an exemplary embodiment, the pixel electrode PE is connected to the drain electrode DE through a contact hole CH of the protection layer 132. The pixel electrode PE may include a transparent conductive material such as indium tin oxide (ITO) or indium zinc oxide (IZO).

The second polarizer 160 is disposed on the display substrate 110. For example, the second polarizer 160 may be disposed on a rear surface of the first substrate 111.

The opposing substrate 120 includes the second substrate 121, the color conversion layer 170, the first polarizer 150, and the common electrode CE. According to the first exemplary embodiment, the opposing substrate 120 may further include a light blocking layer BM.

The second substrate 121 includes transparent materials such as glass or plastic.

The light blocking layer BM is disposed on the second substrate 121. The light blocking layer BM has a plurality of apertures. The apertures are defined corresponding to each of the pixel electrodes PE in first and second pixels PX1 and PX2. The light blocking layer BM blocks light in a portion other than the apertures. For example, the light blocking layer BM is disposed on the thin film transistors TFTs, the gate line GL, and the data line DL, thus blocking light transmitted through the thin film transistors TFTs, the gate line GL, and the data line DL from being emitted outwards. The light blocking layer BM is not invariably necessary, and may be omitted.

The color conversion layer 170 is disposed on the second substrate 121, and converts a wavelength of light incident thereto from the backlight unit 140 to emit light having a different wavelength. According to the first exemplary embodiment, the color conversion layer 170 includes a fluorescent element (e.g., a phosphor).

In more detail, the color conversion layer 170 includes a plurality of color conversion portions 171 and 172, sometimes called first and second color conversion portions 171 and 172. The color conversion portions 171 and 172 include a phosphor that absorbs light having a predetermined wavelength and emits light having a different wavelength from the predetermined wavelength. The color conversion portions 171 and 172 may be separated from each other by the light blocking layer BM.

The respective color conversion portions 171 and 172 are disposed to overlap the pixels PX1 and PX2, e.g., a red pixel PX1 and a green pixel PX2. For example, each of the color conversion portions 171 and 172 may be disposed in an aperture of the light blocking layer BM corresponding to the pixel electrode PE.

Referring to FIG. 3, the color conversion layer 170 includes the first color conversion portion 171 and the second color conversion portion 172. For example, the first color conversion portion 171 may correspond to the red pixel PX1, and the second color conversion portion 172 may correspond to the green pixel PX2. That is, the first color conversion portion 171 emits a red light, and the second color conversion portion 172 emits a green light.

The first color conversion portion 171 includes a red phosphor, and the second color conversion portion 172 includes a green phosphor. According to the first exemplary embodiment, the red phosphor absorbs a blue light to emit a red light, and the green phosphor absorbs a blue light to emit a green light.

The color conversion layer 170 of FIG. 3 includes a transmissive portion 173. A light transmitted through the transmissive portion 173 does not experience a wavelength shift. In a case where the backlight unit 140 irradiates a blue light, the transmissive portion 173 corresponds to a blue pixel PX3.

Although not illustrated, the color conversion layer 170 may further include a third color conversion portion that absorbs a blue light and emits a light having a different color from red and green.

The color conversion portions 171 and 172 constituting the color conversion layer 170 may include a resin including a phosphor. The phosphor is a material that emits fluorescence upon irradiated with light, radiant light, or the like, and emits light having an intrinsic color of the corresponding phosphor. In addition, the phosphor emits light in all directions irrespective of the propagation direction of the irradiated light. The kinds and configuration of the phosphor will be described below.

In addition, the color conversion layer 170 may further include a reflective element. The reflective element may include $TiO_2$, for example. The reflective element may have a particle shape, and may be dispersed in the resin including the phosphor.

The first polarizer 150 is disposed on the color conversion layer 170, and is disposed more adjacent to the light amount control layer 180 than the color conversion layer 170 is thereto. Referring to FIG. 3, the first polarizer 150 is disposed below the color conversion layer 170.

A transmission axis of the first polarizer 150 and a transmission axis of the second polarizer 160 are orthogonal to each other, and one of the transmission axes thereof is parallel to the gate line GL.

The common electrode CE is disposed on the first polarizer 150. For example, the common electrode CE may be disposed over an entire surface of the second substrate 121 including the first polarizer 150. The common electrode CE may include a transparent conductive material such as ITO or IZO.

The common electrode CE, along with the pixel electrodes PE, applies an electric field over the light amount control layer 180. Accordingly, an electric field is formed over a liquid crystal layer, which is the light amount control layer 180, between the common electrode CE and the pixel electrode PE.

Referring to FIG. 3, the light amount control layer 180 is disposed on the display substrate 110, the common electrode CE is disposed on the light amount control layer 180, the first polarizer 150 is disposed on the common electrode CE, the color conversion layer 170 is disposed on the first polarizer 150, and the second substrate 121 is disposed on the color conversion layer 170.

In addition, a first passivation layer 151 may be disposed between the first polarizer 150 and the color conversion layer 170, and a second passivation layer 152 may be disposed between the color conversion layer 170 and the second substrate 121.

In addition, an adhesion layer may be disposed among respective layers to attach one to another.

Hereinbelow, the phosphor included in the color conversion layer 170 will be described in detail.

According to the first exemplary embodiment, the phosphor may use a quantum dot. The quantum dot absorbs light incident thereto and emits light having a different wavelength from a wavelength of the incident light. That is, the quantum dot is a wavelength converting particle that may convert the wavelength of light incident to the quantum dot. A wavelength range a quantum dot may convert may vary depending on the size of the quantum dot. For example, by adjusting the diameter of the quantum dot, the quantum dot may emit light of a desired color.

The quantum dot has a high extinction coefficient and a high quantum yield, as compared to those of other fluorescent dyes, thus emitting significantly intense fluorescence. In particular, the quantum dot may absorb light of a short wavelength and then may emit light of a longer wavelength.

The quantum dot may have a structure including a core and a shell surrounding the core. The shell may have two or more layers. In addition, the quantum dot may further include an organic ligand bonded to the shell and may include an organic coating layer surrounding the shell.

The quantum dot may include at least one substance of group II compound semiconductors, group III compound semiconductors, group V compound semiconductors, and group VI compound semiconductors. In more detail, the core forming the quantum dot may include at least one of: PbSe, InAs, PbS, CdSe, InGaP, CdTe, CdS, ZnSe, ZnTe, ZnS, HgTe and/or HgS. Further, the shell may include at least one of: CuZnS, CdSe, CdTe, CdS, ZnSe, ZnTe, ZnS, HgTe and/or HgS.

Even quantum dots of the same composition may produce different lights depending on their diameters.

The quantum dot may be formed by a wet-chemical process. The wet-chemical process is a method of growing particles by adding a precursor material to an organic solvent.

Figure 4:
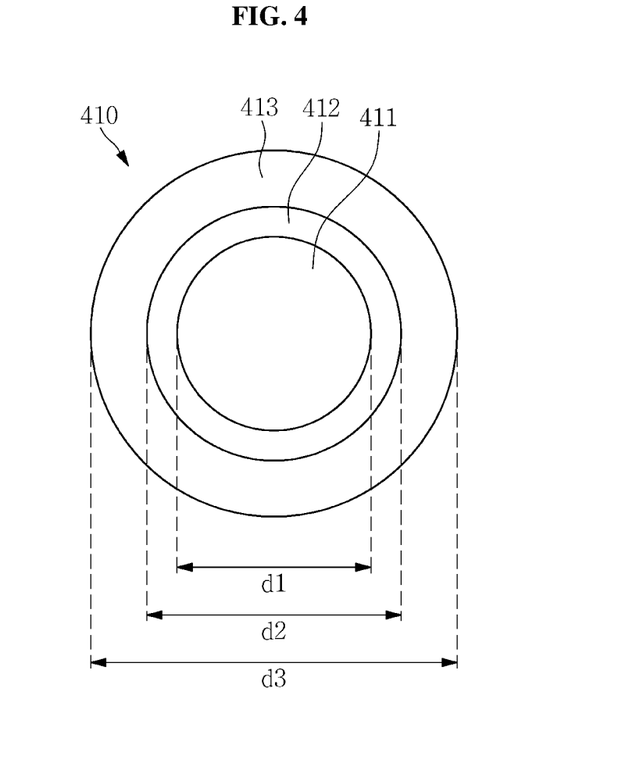
FIG. 4 is a cross-sectional view illustrating an exemplary embodiment of a quantum dot.

FIG. 4 is a cross-sectional view illustrating an exemplary embodiment of a quantum dot 410.

According to the first exemplary embodiment, the quantum dot 410 includes a core 411, a first shell 412 surrounding the core 411, and a second shell 413 surrounding the first shell 412.

The core 411 may include at least one selected from the group consisting of: ZnTe, CdS, and GaP.

The first shell 412 may include at least one selected from the group consisting of: InP, CdSe, ZnSe, and ZnTe.

The second shell 413 may include at least one selected from the group consisting of: ZnS, CdS, GaP, and ZnTe.

For example, the quantum dot 410 may have a structure of "the core 411/the first shell 412/the second shell 413" in the order of arrangement, examples of which include: ZnTe/InP/ZnS, CdS/CdSe/CdS, GaP/InP/GaP, ZnTe/ZnSe/ZnTe, ZnS/ZnSe/ZnS, or ZnS/ZnTe/ZnS.

A quantum efficiency is tested for the quantum dot 410 according to the first exemplary embodiment.

For example, a first mixture is prepared by mixing about 30 part by weight (wt %) of a solid content including the quantum dot 410 having a structure of CdS/CdSe/CdS in the order of "the core 411/the first shell 412/the second shell 413," about 9 wt % of dipentaerythritol pentaacrylate succinic acid monoester (pentafunctional photopolymerizable compound including a carboxylic acid) (TO-1382, manufactured by Donga Chemical Co., Ltd.) as a photo-polymerizable monomer, about 24 wt % of dipentaerythritol hexaacrylate (KAYARAD DPHA, manufactured by Nippon Kayaku Co., Ltd.), about 3 wt % of 1-2-Octanedione-1[(4-phenylthio)phenyl]-2-o-benzoyl-oxime (CGI-184, manufactured by Ciba) as a first photopolymerization initiator, about 2 wt % of 4-phenoxydichloroacetophenone as a second photopolymerization initiator, about 30 wt % of a hydroxylpropyl acrylate-based resin as a binder resin, and about 2 wt % of Irganox 1010 (manufactured by BASF) as an antioxidant.

A second mixture is prepared by diluting the first mixture by adding a solvent to the first mixture so that the content of the quantum dot 410, which is a solid content, is about 20 wt %. In such an exemplary embodiment, propylene glycol monomethyl ether acetate is used as the solvent. The second mixture is stirred to prepare a color conversion layer forming composition.

The quantum efficiency, the central light emission wavelength, and the full width at half maximum (FWHM) of the color conversion layer forming composition are measured using an integrating hemisphere (QE-2100, Otsuka).

A coating layer is formed by coating about 5 ml of the color conversion layer forming composition on a transparent glass substrate having a size of about 7 cm×7 cm. After the coating layer is subjected to a first bake (soft bake), exposure, and then a second bake (hard bake), the glass substrate is rotated so that a film thickness of the coating layer becomes about 3.0 μm.

The coating layer is soft baked at a temperature of about 100° C. for about 2 minutes to prepare a primary color conversion layer. The front external quantum efficiency of the primary color conversion layer is measured using the integrating hemisphere (QE-2100, Otsuka), which is referred to as a first measurement.

The coating layer is irradiated with UV light of about 100 mJ using a UV exposure, and hard baked at a temperature of about 200° C. for about 60 minutes to prepare a secondary color conversion layer. The front external quantum efficiency of the secondary color conversion layer is measured using the integrating hemisphere (QE-2100, Otsuka), which is referred to as a second measurement.

As shown in Table 1, 23 kinds of quantum dots 410 having a structure of CdS (core)/CdSe (first shell)/CdS (second shell) having different specifications are used to prepare color conversion layer forming compositions, primary color conversion layers, and secondary color conversion layers according to Test Examples 1 to 23.

The quantum efficiency, the full width at half maximum (FWHM), and the central light emission wavelength of the color conversion layer forming compositions according to Test Examples 1 to 23 are shown in Table 1.

In addition, the quantum efficiency of the primary color conversion layers and the secondary color conversion layers according to Test Examples 1 to 23 is shown in Table 1. As used herein, the quantum efficiency (first measurement) of the primary color conversion layer corresponds to the quantum efficiency of the color conversion layer before patterning, and the quantum efficiency (second measurement) of the secondary color conversion layer corresponds to the quantum efficiency of the color conversion layer after patterning.

In Table 1, a retention ratio is calculated as a ratio of the second measurement to the first measurement (second measurement/first measurement). The retention ratio represents a relative ratio of the quantum efficiency of the color conversion layer after patterning to the quantum efficiency of the color conversion layer before patterning

TABLE 1

| No. | Quantum dot analysis | | | | Color conversion layer forming composition | | | Color conversion layer | | |
|---|---|---|---|---|---|---|---|---|---|---|
| | Core diameter (nm) | First shell thickness (nm) | Second shell thickness (nm) | Quantum dot diameter (nm) | Central wavelength (nm) | FWHM (nm) | Quantum efficiency (%) | ① First measurement (%) | ② Second measurement (%) | Retention ratio (②/①) (%) |
| 1 | 2.6 | 0.3 | 1.8 | 6.8 | 575 | 35 | 46.4 | 43 | 33 | 76% |
| 2 | 2.6 | 0.3 | 2.8 | 8.8 | 577 | 35 | 59.6 | 55 | 48 | 87% |
| 3 | 2.6 | 0.3 | 3.8 | 10.8 | 580 | 35 | 61.8 | 61 | 56 | 92% |
| 4 | 2.6 | 0.3 | 4.4 | 12.0 | 582 | 36 | 64.3 | 57 | 52 | 92% |
| 5 | 2.6 | 0.3 | 5.8 | 14.8 | 589 | 37 | 65.5 | 55 | 55 | 100% |
| 6 | 2.6 | 0.6 | 1.4 | 6.6 | 593 | 32 | 60.6 | 48 | 37 | 77% |
| 7 | 2.6 | 0.6 | 2.8 | 9.4 | 596 | 32 | 79.7 | 74 | 64 | 87% |
| 8 | 2.6 | 0.6 | 3.3 | 10.4 | 600 | 33 | 81.1 | 78 | 73 | 93% |
| 9 | 2.6 | 0.6 | 4.6 | 13.0 | 605 | 33 | 83.3 | 75 | 73 | 97% |
| 10 | 2.6 | 0.6 | 5.3 | 14.4 | 608 | 35 | 91.0 | 85 | 84 | 99% |
| 11 | 2.6 | 0.9 | 1.3 | 7.0 | 609 | 35 | 73.8 | 75 | 56 | 74% |
| 12 | 2.6 | 0.9 | 2.4 | 9.2 | 614 | 33 | 86.9 | 83 | 71 | 85% |
| 13 | 2.6 | 0.9 | 3.0 | 10.4 | 614 | 33 | 94.0 | 90 | 81 | 90% |
| 14 | 2.6 | 0.9 | 4.0 | 12.4 | 615 | 34 | 99.0 | 100 | 99 | 99% |
| 15 | 2.6 | 0.9 | 5.2 | 14.8 | 618 | 35 | 99.0 | 91 | 90 | 99% |
| 16 | 2.6 | 1.2 | 0.9 | 6.8 | 618 | 38 | 55.3 | 58 | 40 | 69% |
| 17 | 2.6 | 1.2 | 1.7 | 8.4 | 625 | 36 | 74.1 | 76 | 57 | 75% |
| 18 | 2.6 | 1.2 | 2.7 | 10.4 | 627 | 36 | 86.0 | 82 | 72 | 88% |
| 19 | 2.6 | 1.2 | 4.1 | 13.2 | 630 | 41 | 98.9 | 96 | 91 | 95% |
| 20 | 2.6 | 1.2 | 4.9 | 14.8 | 636 | 39 | 99.5 | 93 | 90 | 97% |
| 21 | 2.6 | 1.5 | 4.7 | 15.0 | 640 | 41 | 91.0 | 86 | 83 | 96% |
| 22 | 3.0 | 0.8 | 5.2 | 15.0 | 621 | 35 | 99.0 | 92 | 91 | 99% |
| 23 | 3.8 | 0.6 | 5.0 | 15.0 | 620 | 36 | 91.2 | 87 | 86 | 99% |

Referring to Table 1, the color conversion layer according to the first exemplary embodiment has an excellent retention ratio. In the color conversion layer according to the first exemplary embodiment, a decrease in quantum efficiency after patterning is not large.

As described above, the quantum dot 410 according to the first exemplary embodiment has high quantum efficiency.

As used herein, a ratio at which a quantum dot reabsorbs the light generated from the quantum dot is called "self-reabsorptivity." The quantum dot 410 according to the first exemplary embodiment has low self-reabsorptivity. Accordingly, the power consumption of the display device 101 may be reduced.

Referring to Table 1 and FIG. 4, the quantum dot 410 according to the first exemplary embodiment may have a diameter d3 ranging from about 2 nm to about 32 nm. For example, the quantum dot 410 may have the diameter d3 ranging from about 9 nm to 15 nm.

The core 411 of the quantum dot 410 may have a diameter d1 ranging from about 0.4 nm to about 7 nm. For example, the core 411 may have the diameter d1 ranging from about 2 nm to about 4 nm.

The first shell 412 of the quantum dot 410 may have a thickness ranging from about 0.2 nm to about 2.5 nm and a diameter d2. For example, the first shell 412 may have the thickness ranging from about 0.3 nm to about 1.5 nm. Referring to FIG. 4, the thickness of the first shell 412 may be obtained by (d2−d1)/2.

The second shell 413 of the quantum dot 410 may have a thickness ranging from about 0.5 nm to about 10 nm and a diameter d3. For example, the second shell 413 may have the thickness ranging from about 3 nm to about 5 nm. Referring to FIG. 4, the thickness of the second shell 413 may be obtained by (d3−d2)/2.

The display device 101 according to the first exemplary embodiment that includes the color conversion layer 170 including the phosphor of such quantum dots has excellent light emission efficiency and excellent color rendering capability.

Figure 5:
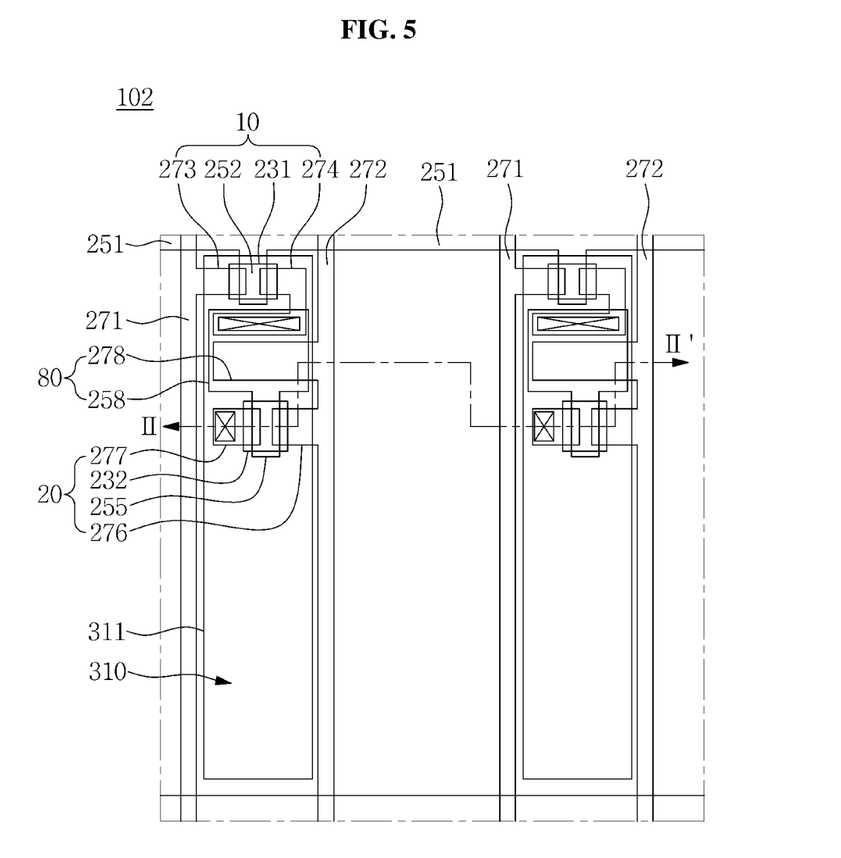
FIG. 5 is a plan view illustrating an organic light emitting diode ("OLED") display device according to a second exemplary embodiment.
Figure 6:
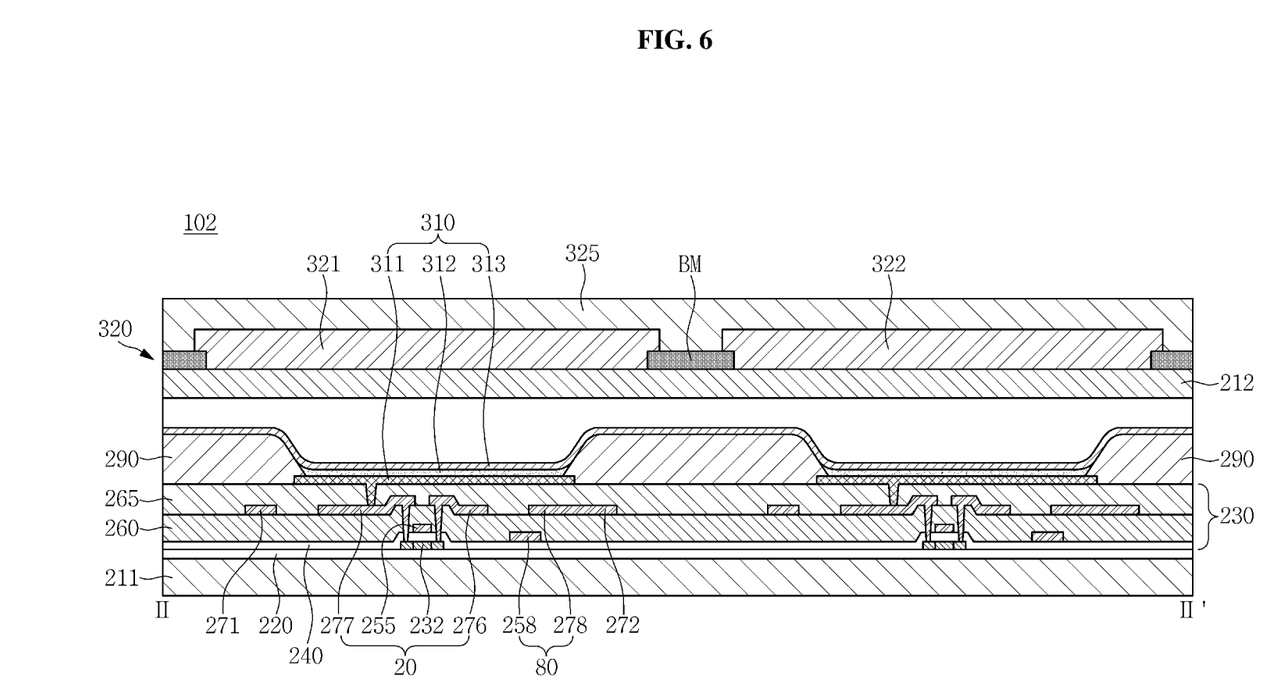
FIG. 6 is a cross-sectional view taken along line II-II' of FIG. 5.

FIG. 5 is a plan view illustrating an organic light emitting diode ("OLED") display device 102 according to a second exemplary embodiment, and FIG. 6 is a cross-sectional view taken along line II-II' of FIG. 5.

For example, the OLED display device 102 according to the second exemplary embodiment includes a base substrate 211, a driving circuit unit 230, and an OLED 310.

The base substrate 211 may include an insulating material selected from the group consisting of: glass, quartz, ceramic, plastic, or the like. In an alternative exemplary embodiment, a polymer film may be used as the base substrate 211.

A buffer layer 220 is disposed on the base substrate 211. The buffer layer 220 may include at least one layer selected from various inorganic layers and organic layers. The buffer layer 220 may be omitted.

The driving circuit unit 230 is disposed on the buffer layer 220. The driving circuit unit 230 includes a plurality of TFTs 10 and 20 and drives the OLED 310. That is, the OLED 310 emits light according to a driving signal applied from the driving circuit unit 230, thereby displaying images.

FIGS. 5 and 6 illustrate an active matrix-type organic light emitting diode (AMOLED) as the OLED display device 201 having a 2TR-1Cap structure. For example, the 2TR-1Cap structure may include two TFTs, e.g., a switching TFT 10 and a driving TFT 20, and one capacitor 80 in each pixel, but the second exemplary embodiment is not limited thereto. For example, the OLED display device 201 may include three or more TFTs and two or more capacitors in each pixel, and may further include additional wirings. Herein, the term "pixel" refers to a smallest unit for displaying an image, and the OLED display device 201 displays an image using a plurality of pixels.

Each pixel includes the switching TFT 10, the driving TFT 20, the capacitor 80, and the OLED 310. In addition, a gate line 251 extending along a direction, and a data line 271 and a common power line 272 insulated from and intersecting the gate line 251 are disposed in the driving circuit unit 230. Each pixel may be defined by the gate line 251, the data line 271, and the common power line 272 as a boundary, but exemplary embodiments are not limited thereto. The pixels may be defined by a pixel defining layer 290 or a black matrix, e.g., the light blocking layer BM.

The OLED 310 includes a first electrode 311, an organic light emitting layer 312 on the first electrode 311, and a second electrode 313 on the organic light emitting layer 312. The organic light emitting layer 312 may include a low molecular weight organic layer or a high molecular weight organic layer. Holes and electrons are applied from the first electrode 311 and the second electrode 313, respectively, into the organic light emitting layer 312 and then combined with each other therein to form an exciton. The OLED 310 may emit light by energy generated when the exciton falls from an excited state to a ground state.

The capacitor 80 includes a pair of capacitor plates 258 and 278, having an insulating interlayer 260 interposed therebetween. In such an exemplary embodiment, the insulating interlayer 260 may be a dielectric element. A capacitance of the capacitor 80 is determined by electric charges accumulated in the capacitor 80 and a voltage across the pair of capacitor plates 258 and 278.

The switching TFT 10 includes a switching semiconductor layer 231, a switching gate electrode 252, a switching source electrode 273, and a switching drain electrode 274. The driving TFT 20 includes a driving semiconductor layer 232, a driving gate electrode 255, a driving source electrode 276, and a driving drain electrode 277. A gate insulating layer 240 is further provided to insulate the semiconductor layers 231 and 232 and the gate electrodes 252 and 255.

The switching TFT 10 may function as a switching element which selects a pixel to perform light emission. The switching gate electrode 252 is connected to the gate line 251, and the switching source electrode 273 is connected to the data line 271. The switching drain electrode 274 is spaced apart from the switching source electrode 273 and connected to one of the capacitor plates, e.g., the capacitor plate 258.

The driving TFT 20 applies a driving power, which allows the organic light emitting layer 312 of the OLED 310 in a selected pixel to emit light, to the first electrode 311 which is a pixel electrode. The driving gate electrode 255 is connected to the capacitor plate 258 that is connected to the switching drain electrode 274. Each of the driving source electrode 276 and the other of the capacitor plates, e.g., the capacitor plate 278, is connected to the common power line 272. The driving drain electrode 277 is connected to the first electrode 311 of the OLED 310 through a contact hole defined in a planarization layer 265.

With the above-described structure, the switching TFT 10 is operated based on a gate voltage applied to the gate line 251 and serves to transmit a data voltage applied to the data line 271 to the driving TFT 20. A voltage equivalent to a difference between a common voltage applied to the driving TFT 20 from the common power line 272 and the data voltage transmitted by (or from) the switching TFT 10 is stored in the capacitor 80, and a current corresponding to the voltage stored in the capacitor 80 flows to the OLED 310 through the driving TFT 20 such that the OLED 310 may emit light.

According to the second exemplary embodiment, the first electrode 311 is an anode.

The first electrode 311 may be a transmissive electrode having light transmittance, or may be a reflective electrode having light reflectance. The second electrode 313 may include a semitransmissive layer or a reflective layer.

According to the second exemplary embodiment, the first electrode 311 is a reflective electrode, and the second electrode 313 is a semitransmissive electrode. Light emitted from the organic light emitting layer 312 is transmitted through the second electrode 313 to be emitted outwards.

At least one of a hole injection layer HIL and a hole transporting layer HTL may further be disposed between the first electrode 311 and the organic light emitting layer 312, and at least one of an electron transporting layer ETL and an electron injection layer EIL may further be disposed between the organic light emitting layer 312 and the second electrode 313. The organic light emitting layer 312, the hole injection layer HIL, the hole transporting layer HTL, the electron transporting layer ETL, and the electron injection layer EIL may include an organic material, and thus may be referred to as an organic layer.

The pixel defining layer 290 has an aperture. The aperture of the pixel defining layer 290 exposes a portion of the first electrode 311. The organic light emitting layer 312 and the second electrode 313 are sequentially stacked on the first electrode 311 in the aperture of the pixel defining layer 290. In such an exemplary embodiment, the second electrode 313 may also be disposed on the pixel defining layer 290 as well as on the organic light emitting layer 312. In addition, the HIL, the HTL, the ETL, and the EIL may also be disposed between the pixel defining layer 290 and the second electrode 313. The OLED 310 emits light from the organic light emitting layer 312 in the aperture of the pixel defining layer 290. As such, the pixel defining layer 290 may define a light emission area.

A capping layer (not illustrated) may be disposed on the second electrode 313 to protect the OLED 310 from the external environment.

An encapsulation substrate 212 is disposed on the second electrode 313. The encapsulation substrate 212, along with the base substrate 211, serves to seal the OLED 310. The encapsulation substrate 212, similar to the base substrate 211, may include an insulating material selected from the group consisting of: glass, quartz, ceramic, plastic, and the like.

A color conversion layer 320 is disposed on the encapsulation substrate 212. The color conversion layer 320 converts a wavelength of light incident from the OLED 310 and emits light having a different wavelength. According to the second exemplary embodiment, the color conversion layer 320 includes a phosphor.

The color conversion layer 320 includes a plurality of color conversion portions 321 and 322, sometimes called first and second color conversion portions 321 and 322. The color conversion portions 321 and 322 include a phosphor that absorbs light having a predetermined wavelength and emits light having a different wavelength from the predetermined wavelength. The color conversion portions 321 and 322 may be separated from each other by the light blocking layer BM.

Each of the color conversion portions 321 and 322 is disposed to overlap the organic light emitting layer 312.

According to the second exemplary embodiment, the OLED 310 emits a blue light. That is, the organic light emitting layer 312 emits a blue light.

Referring to FIG. 5, the color conversion layer 320 includes the first color conversion portion 321 and the second color conversion portion 322. For example, the first color conversion portion 321 may correspond to a red pixel, and the second color conversion portion 322 may correspond to a green pixel. That is, the first color conversion portion 321 absorbs a blue light to emit a red light, and the second color conversion portion 322 absorbs a blue light to emit a green light. The first color conversion portion 321 may include a red phosphor, and the second color conversion portion 322 may include a green phosphor. The phosphor is described hereinabove, and thus detailed descriptions pertaining thereto will be omitted.

According to the second exemplary embodiment, the color conversion layer 320 may further include a transmissive portion (not illustrated). A light transmitted through the transmissive portion does not experience wavelength shift. The transmissive portion may correspond to a blue pixel.

Although not illustrated, the color conversion layer 320 may further include a third color conversion portion that absorbs a blue light to emit a light of a different color other than red and green.

In addition, referring to FIG. 6, a transparent protection layer 325 for protecting the color conversion portions 321 and 322 is disposed on the color conversion layer 320.

Figure 7:
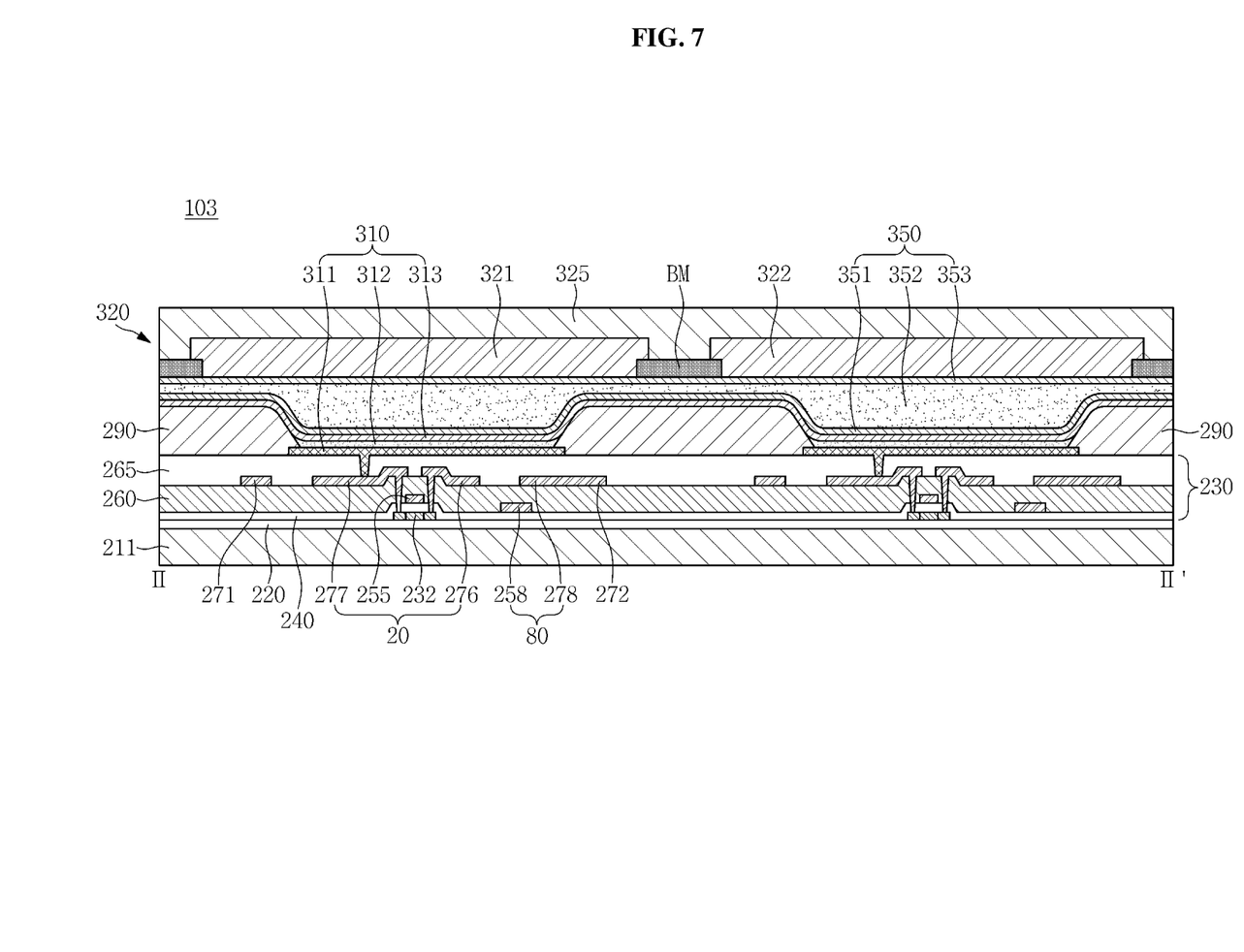
FIG. 7 is a cross-sectional view illustrating an OLED display device according to a third exemplary embodiment.

FIG. 7 is a cross-sectional view illustrating an OLED display device 103 according to a third exemplary embodiment. The OLED display device 103 according to the third exemplary embodiment includes a thin film encapsulation layer 350 disposed on the second electrode 313 to protect the OLED 310.

The thin film encapsulation layer 350 includes at least one inorganic layer 351 and 353 and at least one organic layer 352 to prevent outside air, such as moisture and oxygen, from permeating into the OLED 310.

The thin film encapsulation layer 350 may have a structure in which at least one inorganic layer 351 and 353 and at least one organic layer 352 are alternately stacked. In FIG. 7, the thin film encapsulation layer 350 includes two inorganic layers 351 and 353 and one organic layer 352, but the third exemplary embodiment is not limited thereto.

Each of the inorganic layers 351 and 353 may include one or more inorganic material of: $Al_2O_3$, $TiO_2$, $ZrO$, $SiO_2$, $AlON$, $AlN$, $SiON$, $Si_3N_4$, $ZnO$, and $Ta_2O_5$. The inorganic layers 351 and 353 may be formed through methods such as a chemical vapor deposition (CVD) method or an atomic layer deposition (ALD) method. However, the third exemplary embodiment is not limited thereto, and the inorganic layers 351 and 353 may be formed using various methods known to those skilled in the art.

The organic layer 352 may include a polymer-based material. Examples of the polymer-based material may include, for example, an acrylic resin, an epoxy resin, polyimide, and polyethylene. The organic layer 352 may be formed through a thermal deposition process. The thermal deposition process for forming the organic layer 352 may be performed at a temperature range that may not damage the OLED 310. However, the third exemplary embodiment is not limited thereto, and the organic layer 352 may be formed using various methods known to those skilled in the pertinent art.

The inorganic layers 351 and 353 which have a high density of thin film may prevent or efficiently reduce infiltration of, mostly, moisture or oxygen. Infiltration of moisture and oxygen into the OLED 310 may be largely prevented by the inorganic layers 351 and 353.

Moisture and oxygen that have passed through the inorganic layers 351 and 353 may further be blocked by the organic layer 352. The organic layer 352 may have relatively low moisture-infiltration preventing efficacy, as compared to the inorganic layers 351 and 353. However, the organic layer 352 may also serve as a buffer layer to reduce stress among respective ones of the inorganic layers 351 and 353 and the organic layer 352, in addition to the moisture-infiltration preventing function. Further, since the organic layer 352 has planarization characteristics, an uppermost surface of the thin film encapsulation layer 350 may be planarized by the organic layer 352.

The thin film encapsulation layer 350 may have a thickness of about 10 µm or less. Accordingly, the OLED display device 103 may also have a significantly small thickness. By applying the thin film encapsulation layer 350 in such a manner, the OLED display device 103 may have flexible characteristics.

The color conversion layer 320 is disposed on the thin film encapsulation layer 350. The color conversion layer 320 is described hereinabove, and thus detailed descriptions pertaining thereto will be omitted.

In a case where the encapsulation substrate 212 (illustrated in FIG. 6) is not provided as in the embodiment of FIG. 7, and a flexible substrate is used as the base substrate 211, the OLED display device 103 according to the third exemplary embodiment may become a flexible display device.

As set forth above, according to one or more exemplary embodiments, the display device includes the color conversion layer including a phosphor and has excellent color representation capability.

While the inventive concept has been shown and described with reference to the exemplary embodiments thereof, it will be apparent to those of ordinary skill in the art that various changes in form and detail may be made thereto without departing from the spirit and scope of the inventive concept.

What is claimed is:

1. A display device comprising:
    a display substrate;
    a light amount control layer on the display substrate;
    a first polarizer on the light amount control layer; and
    a color conversion layer on the first polarizer,
    wherein the color conversion layer comprises a resin comprising a phosphor and a reflective element,
    the phosphor comprises a quantum dot, the quantum dot comprising: a core; a first shell surrounding the core; and a second shell surrounding the first shell, wherein the first shell comprises at least one of: InP, CdSe, ZnSe, and ZnTe, and
    the quantum dot has a diameter ranging from about 2 nm to about 32 nm,
    wherein the first shell has a thickness ranging from about 0.2 nm to about 2.5 nm, and
    wherein the second shell has a thickness ranging from about 3 nm to about 5 nm.

2. The display device as claimed in claim 1, wherein the quantum dot has a diameter ranging from about 9 nm to about 15 nm.

3. The display device as claimed in claim 1, wherein the core has a diameter ranging from about 0.4 nm to about 7 nm.

4. The display device as claimed in claim 3, wherein the core has a diameter ranging from about 2 nm to about 4 nm.

5. The display device as claimed in claim 1, wherein the first shell has a thickness ranging from about 0.3 nm to about 1.5 nm.

6. The display device as claimed in claim 5, wherein the color conversion layer further comprises a transmissive portion configured to transmit a blue light.

7. The display device as claimed in claim 1, wherein the color conversion layer comprises:
    a red color conversion portion configured to absorb a blue light to emit a red light; and
    a green color conversion portion configured to absorb a blue light to emit a green light.

8. The display device as claimed in claim 1, further comprising a second polarizer on the display substrate.

9. The display device as claimed in claim 1, wherein the light amount control layer comprises a liquid crystal layer.

10. The display device as claimed in claim 1, wherein the core comprises at least one of: ZnTe, CdS, and GaP.

11. The display device as claimed in claim 1, wherein the second shell comprises at least one of: ZnS, CdS, GaP, and ZnTe.

12. The display device as claimed in claim 1, wherein the reflective element comprises $TiO_2$.

13. The display device as claimed in claim 1, wherein the reflective element has a particle shape and is dispersed in the resin.

* * * * *